(12) United States Patent
Garbuzov et al.

(10) Patent No.: US 6,366,018 B1
(45) Date of Patent: Apr. 2, 2002

(54) APPARATUS FOR PERFORMING WAVELENGTH-CONVERSION USING PHOSPHORS WITH LIGHT EMITTING DIODES

(75) Inventors: Dmitri Zalmanovich Garbuzov, Princeton; John Charles Connolly, Clarksburg; Robert Frank Karlicek, Jr., Flemington; Ian Thomas Ferguson, Princeton, all of NJ (US)

(73) Assignees: Sarnoff Corporation, Princeton; Emcore Corporation, Somerset, both of NJ (US)

( * ) Notice: Subject to any disclaimer, the term of this patent is extended or adjusted under 35 U.S.C. 154(b) by 0 days.

(21) Appl. No.: 09/420,905

(22) Filed: Oct. 20, 1999

Related U.S. Application Data (60) Provisional application No. 60/105,056, filed on Oct. 21, 1998.

(51) Int. Cl.[7] .................................................. H01J 43/12
(52) U.S. Cl. ........................ 313/542; 313/112; 313/113
(58) Field of Search ................................. 313/112, 113, 313/114, 502, 506, 542; 362/293, 800, 260; 257/98, 97, 13

(56) References Cited

U.S. PATENT DOCUMENTS

| | | |
|---|---|---|
| 5,399,499 A | 3/1995 | Paz-Pujalt et al. |
| 5,684,360 A | 11/1997 | Baum et al. |
| 5,813,752 A * | 9/1998 | Singer et al. ................ 362/293 |
| 5,813,753 A | 9/1998 | Vriens et al. ................ 362/293 |
| 5,835,119 A | 11/1998 | Samuels ...................... 347/238 |
| 5,847,507 A | 12/1998 | Butterworth et al. ........ 313/512 |
| 5,851,063 A | 12/1998 | Doughty et al. ............. 362/231 |
| 5,886,401 A | 3/1999 | Liu .............................. 257/678 |
| 5,895,932 A | 4/1999 | Bojarczuk, Jr. et al. ..... 257/103 |
| 5,898,185 A | 4/1999 | Bojarczuk, Jr. et al. ..... 257/103 |
| 5,952,681 A * | 9/1999 | Chen ............................ 257/89 |
| 5,959,307 A | 9/1999 | Nakamura et al. ............ 257/14 |
| 5,959,316 A | 9/1999 | Lowery ........................ 257/98 |
| 5,962,843 A | 10/1999 | Sinor et al. |
| 5,982,092 A | 11/1999 | Chen |
| 5,994,722 A | 11/1999 | Avebeck et al. |
| 5,998,925 A * | 12/1999 | Shimizu et al. ............. 313/503 |
| 6,121,726 A * | 10/2000 | Codama et al. ............. 313/504 |

FOREIGN PATENT DOCUMENTS

EP      0 936 682 A1    8/1999

OTHER PUBLICATIONS

*Physical Review Letters*, The American Physical Society, vol. 72, No. 3, "Optical Properties of Manganese–Doped Nanocrystals of ZnS", Jan. 17, 1994, pp. 416–419.

*Journal of Applied Physics*, American Institute of Physics, vol. 80, No. 8, "Organic films deposited on Si p–n junctions: Accurate measurements on fluorescence internal efficiency, and application ot luminescent antireflection coating", Oct. 15, 1996, pp. 4644–4648.

(List continued on next page.)

Primary Examiner—Nimeshkumar D. Patel
(74) Attorney, Agent, or Firm—William J. Burke

(57) ABSTRACT

An apparatus, comprises an active region, a phosphor layer and a reflective layer. The active region is configured to emit light having a first band of wavelengths from a first group of wavelengths. The phosphor layer is disposed between and in contact with the active region and an exterior medium. The phosphor layer is configured to convert the first band of wavelengths of light emitted from the active region to a second band of wavelengths. A center wavelength of the second band of wavelengths is greater than a center wavelength of the first band of wavelengths. The reflective layer is optically coupled to the active region. The active region is disposed between the reflective layer and the phosphor layer. The reflective layer is configured to reflect at least the first band of wavelengths and the second band of wavelengths.

27 Claims, 4 Drawing Sheets

OTHER PUBLICATIONS

Walter Viehman, SPIE, vol. 196, *Measurement of Optical Radiations*, "Thin–film scintillators for extended ultraviolet (UV) response silicon detectors", 1979, pp. 90–95.

*Applied Physics Letters*, American Institute of Physics, vol. 59, No. 12, "Reflective filters based on single–crystal GAN/$Al_xGA_{1-x}N$ multilayers deposited using low–pressure metalorganic chemical vapor deposition", Sep. 16, 1991, pp. 1449–1451.

*Applied Physics Letters*, American Institute of Physics, vol. 67, No. 13, "High–power InGAN single–quantum–well–structure blue and violet light–emitting diodes", Sep. 25, 1995, pp. 1868–1870.

Denbaars S. P., Gallium–nitride based materials for blue to utaviolet optoelectronics devices, IEEE vol. 5 Nov. 11, 1997.

Nakamara, S. "III–V Nitride–Based Short–Wavelength LEDs and LDs"S, Series on Semiconductor Science Technology, Oxford University Press Inc., #6, 1998, pp 391–416.

PCT International Search Report corresponding to PCT Application PCT/US99/24911.

PCT International Search Report corresponding to PCT Application PCT/US99/24902.

\* cited by examiner

APPARATUS FOR PERFORMING WAVELENGTH-CONVERSION USING PHOSPHORS WITH LIGHT EMITTING DIODES

RELATED APPLICATIONS

This application claims the benefit of U.S. Provisional application Ser. No. 60/105,056, filed Oct. 21, 1998.

BACKGROUND OF THE INVENTION

The present invention relates generally to light emitting diodes. More specifically, the present invention relates to methods and apparatus for performing wavelength-conversion using phosphors with light emitting diodes.

Until recently, the external efficiency of light-emitted diodes (LEDs) that emitted light having wavelengths between ultraviolet and blue was very low, e.g., in the range of thousandths of one percent, relative to other devices such as red-emitting AlGaAs LEDs. Achievements in InGaN/AlGaN quantum well devices, however, have allowed the construction of LEDs emitting wavelengths between ultraviolet and blue with efficiencies comparable to those of the best red-emitting or yellow-emitting LEDs. For example, the external efficiency of InGaN/AlGaN LEDs at room temperature are reported to reach 10% at emission wavelengths of 400 to 450 nm. See Nakamura et al., Appl. Phys. Lett. 67 (13), 1995, p. 1868; see also U.S. Pat. No. 5,959,307 to Nakamura et al. which is incorportated herein. Taking into account the high refractive index of InGaN/AlGaN, a 10% external efficiency implies an internal efficiency close to 100%. Thus, the internal efficiency of these LEDs emitting wavelengths between ultraviolet and blue is higher than that of well known red-emitting or yellow-emitting LEDs.

Due to the relatively high efficiencies of LEDs emitting wavelengths between ultraviolet and blue, such devices can form a superior basis for designing devices that emit light having a wavelength(s) from green to red. Known systems, however, fail to incorporate LEDs emitting wavelengths between ultraviolet and blue effectively.

SUMMARY OF THE INVENTION

An apparatus, comprises an active region, a phosphor layer and a reflective layer. The active region is configured to emit light having a first band of wavelengths from a first group of wavelengths. The phosphor layer is disposed between and in contact with the active region and an exterior medium. The phosphor layer is configured to convert the first band of wavelengths of light emitted from the active region to a second band of wavelengths. A center wavelength of the second band of wavelengths is greater than a center wavelength of the first band of wavelengths. The reflective layer is optically coupled to the active region. The active region is disposed between the reflective layer and the phosphor layer. The reflective layer is configured to reflect at least the first band of wavelengths and the second band of wavelengths.

DETAILED DESCRIPTION

Figure 1:
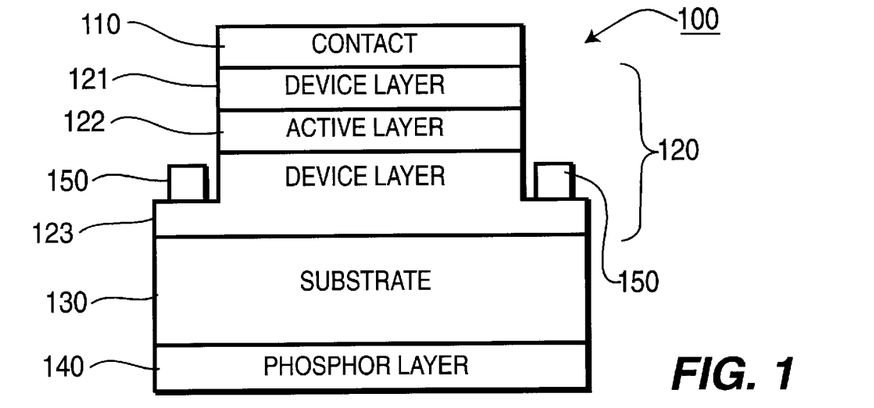
FIG. 1 illustrates a light-emitting device according to an embodiment of the present invention.

FIG. 1 illustrates a light-emitting device according to an embodiment of the present invention. Light-emitting device 100 includes contact layer 110, active region 120, substrate 130, phosphor layer 140 and contact 150. Active region 120 can further include device layer 121, active layer 122, and device layer 123.

Active region 120 can be any type of layer(s), which through the stimulated emission process, produces light having a particular band of wavelengths. This particular band of wavelengths can be a subset of a large group of wavelengths that can be produced by a particular active layer. For example, an active layer 122 constructed of at least $Al_xGa_{1-x}N$, where x is a value between 0 and 1, can produce light having a band of wavelengths between approximately 300 nanometers and approximately 500 nanometers. This range of wavelengths (i.e., 300 nm to 500 nm) can be characterized as being between ultraviolet and blue. Said another way, the group of possible wavelengths produced by active layer 122 can be described as wavelengths producible by an active region constructed of at least $Al_xGa_{1-x}N$, where x is a value between 0 and 1.

In one embodiment, the active layer 122 can be constructed of at least InGaN/$Al_xGa_{1-x}N$, device layer 121 can be a p-type AlGaN layer in contact with active layer 122, and device layer 123 can be an n-type AlGaN layer disposed between and in contact with active layer 122 and substrate 130. This type of active region has been described in previous publications. The active region 120 can be activated by contact 110 and contact 150 where contact 150 has a ring shape around the device layer 123.

Note that the terms "device layer" and "active layer" each can include multiple layers such as a superlattice structure having multiple layers. For example, a p-type device layer can comprise multiple layers that overall exhibit a p-type behavior. Specific to FIG. 1, device layer 121, active layer 122, device layer 123 each can comprise, for example, multiple layers having, for example, a superlattice structure.

Substrate 130 can be any type of substrate such as a sapphire substrate, silicon carbide or any other material that can be appropriately constructed adjacent to device layer 123.

Phosphor layer 140 can be any appropriate type of coating having a matrix of wavelength-converting phosphors embedded within a binding material. The term "phosphor" is intended to mean any substance capable of luminescence while converting the wavelength(s) of incident light. "Phosphors" can include, for example, polymers capable of luminescence. Table 1 illustrates a number of example coatings from which phosphor layer 140 can be constructed.

| Coating: | Wavelength of max. emission (nm) | Photon conversion efficiency at wavelength of excitation: | | | | |
|---|---|---|---|---|---|---|
| | | 254 nm | 312 nm | 365 nm | 405 nm | 436 nm |
| PPO in 2045 | 400 | 0.49 | 0.80 | — | — | — |
| Bis-MSB in 2045 | 450 | 0.74 | 0.93 | 0.94 | — | — |
| "Blue Coating"(p-terph. + PPO + Bis-MSB in 2045) | 430 | 0.93 | 0.92 | 0.95 | — | — |
| Hostasol 8G | 510 | 0.12 | 0.21 | 0.10 | 0.18 | 0.17 |
| Laser dye #481 in 2045 | 490 | 0.75 | 0.39 | 0.83 | 0.91 | 0.90 |
| Laser dye #495 in 2045 | 520 | 0.21 | 0.10 | 0.28 | 0.34 | 0.36 |
| "Green Coating" (#481 + Hostasol 8G in 2045) | 510 | 0.80 | 0.42 | 0.85 | 0.95 | 0.95 |
| BBQ in 2045 | 495 | 0.78 | 0.62 | 0.83 | 0.87 | 0.82 |
| "Red Coating" (#481 + Hostasol 8G & Hostasol GG in 2045) | 610 | 0.55 | 0.38 | 0.76 | 0.90 | 0.93 |

Note that although contact 110 is shown in FIG. 1 as extending over the entire surface of device layer 121, the contact 110 can be configured in a way that allows the appropriate excess carrier concentration within the active layer 133 via contacts 110 and 150. For example, contact 110 can be configured with a ring shape.

Figure 2:
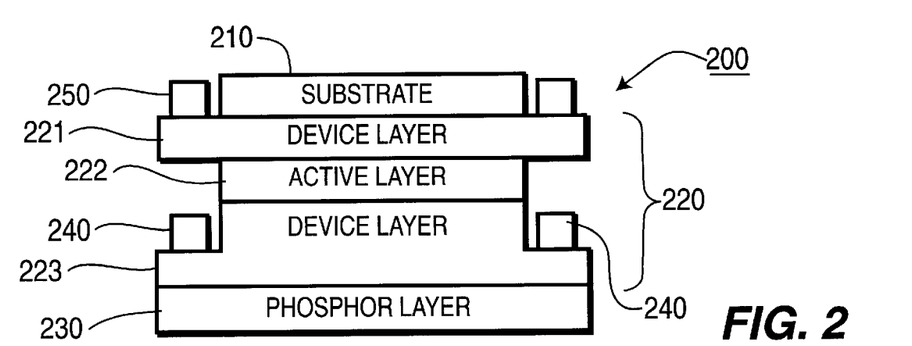
FIG. 2 shows a light-emitting device according to another embodiment of the present invention.

FIG. 2 shows a light-emitting device according to another embodiment of the present invention. The light-emitting device 200 shown in FIG. 2 is similar to light-emitting device 100 shown in FIG. 1 except that the substrate layer 130 of device 100 is not disposed between the active region and the phosphor layer, and the phosphor layer has been directly disposed in contact with one of the device layers. More specifically, light-emitting device 200 includes substrate 210, contact 250, active region 220, phosphor layer 230, and contact 240. Active region 220 includes device layer 221, active layer 222 and device layer 223.

The particular configuration of embodiments of the present invention can vary depending upon the concentration of phosphors within the phosphor layer. The following discussion distinguishes between the two types of configurations and indicates methods for designing light-emitting devices for each configuration type.

Assume that the spontaneous emission within the active layer (e.g., active layer 122 shown in FIG. 1; active layer 222 shown in FIG. 2) is radiated isotropically and neglect radiation emitted in the direction opposite to the phosphor layer (e.g., phosphor layer 140 in FIG. 1; phosphor layer 230 in FIG. 2). In this case, if no other layers between the active region and the phosphor layer with reflective indices smaller than the refractive index of the phosphor layer, $n_c$, then the following equation estimates the coupling efficiency, $\eta_c$, i.e., the fraction of radiation emitted from the active layer that is coupled to the phosphor layer:

$$\eta_c \cong \frac{1}{2}\left(1 - \sqrt{1 - \left[\frac{n_c}{n_a}\right]^2}\right) \quad (1)$$

In equation (1), $n_a$ is the refractive index of the device layer of the active region disposed between (but not necessarily in contact with) the active layer of the active region and the phosphor layer. For example, as shown in FIG. 1, $n_a$ relates to the device layer 123; as shown in FIG. 2, $n_a$ relates to device layer 223.

Equation (1) takes into account total internal reflection for excitation radiation propagating into the phosphor layer and neglects Fresnel reflection at the internal layer interfaces (e.g., the interface at substrate 130 and phosphor layer 140 as shown in FIG. 1). As equation (1) shows, the coupling efficiency, $\eta_c$, from the active region to the phosphor layer increases with the phosphor layer refractive index, $n_c$, increasing; however, the coupling efficiency for the interface between the phosphor layer and the medium exterior to phosphor layer (e.g., air) decreases as $n_c$ increases. Equation (2) can be used to estimate the coupling efficiency, $\eta_p$, of the interface between the phosphor layer and the medium exterior to phosphor layer:

$$\eta_P = \frac{1}{2}\left(1 - \sqrt{1 - \left[\frac{1}{n_c}\right]^2}\right)\frac{4n_c}{(1+n_c)^2} \cong \frac{1}{n_c(n_c+1)^2} \quad (2)$$

In equation (2), Fresnel reflection at the interface of the phosphor layer and the medium exterior to phosphor layer, as well as total internal reflection at this interface is considered. The product of equations (1) and (2) produces (under the approximation of one light-path emitters) the upper limits for external efficiency of the light-emitting device, $\eta_e$ as a function $n_c$.

Figure 3:
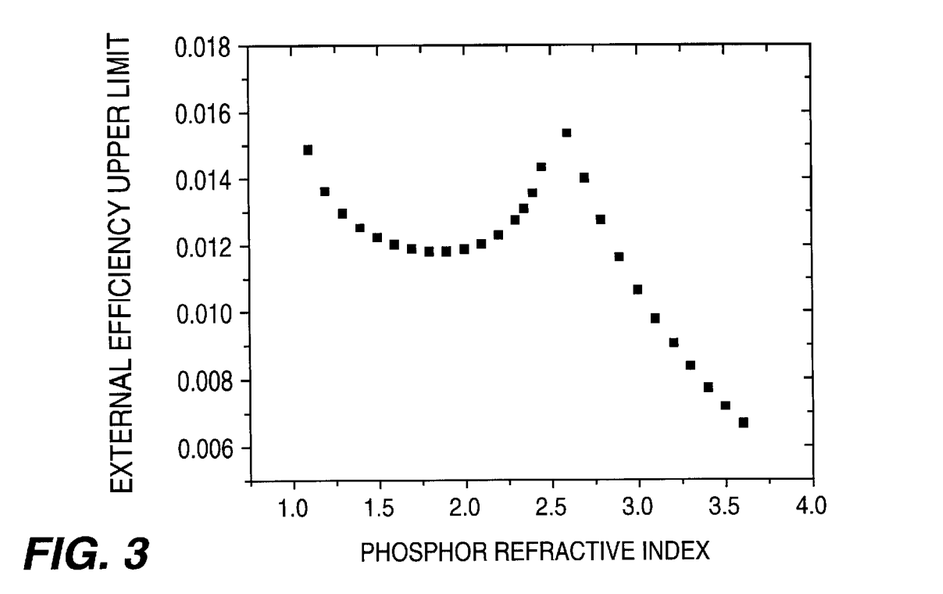
FIG. 3 is a graph showing the external efficiency upper limit versus the refractive index of a phosphor layer for a light-emitting device, according to an embodiment present.

FIG. 3 is a graph showing the external-efficiency upper limit versus the refractive index of a phosphor layer for a light-emitting device, according to an embodiment present. As FIG. 3 shows, the external efficiency of the device, $\eta_e$, is maximum when $n_c$ equals $n_a$. Consequently, Fresnel reflection at the interface of the device can be neglected at optimum conditions, e.g., in index-matched devices. Such considerations are a reasonable basis for the selecting a phosphor layer having a particular refractive index when no intervening layers or materials are present between the active region and the phosphor layer (e.g., when a substrate is not disposed between the active region and the phosphor layer such as shown in FIG. 2).

Such an approach, however, is not appropriate when a substrate is disposed between the active region and the phosphor layer, such as light-emitting device 100 shown in FIG. 1. This approach is not appropriate here because the substrate 130 will typically have a refractive index less than the active region refractive index, $n_a$. For example, when the substrate 130 is constructed of sapphire, its refractive index is approximately 1.75, which is considerably less than the active region refractive index (e.g. $n_a$=2.25). A phosphor layer having a refractive index greater than the refractive index of the substrate does not improve the external efficiency, $\eta e$, because the efficiency is limited by the interface of the active region and the substrate. In other words, increasing $n_c$ in die range of $n_c > n_s$ does not improve the efficiency of the phosphor pumping (i.e., the coupling efficiency of active region to the phosphor layer).

Consequently, when a substrate is not disposed between the active region and the phosphor (e.g., light-emitting device 200 shown in FIG. 2), external efficiency of a light-emitting device can be maximized when the refractive index of the phosphor layer (e.g., phosphor layer 230) substantially equals the refractive index of the device layer of the active region adjacent to the phosphor layer (e.g., device layer 223). Conversely, when a substrate is disposed between the active region and the phosphor layer (e.g., light-emitting device 100 shown in FIG. 1), the refractive index of the substrate (e.g., substrate 130) and the refractive region of the phosphor layer (e.g., phosphor layer 140) should be substantially equal.

The term "substantially equal" in this context means as close as practical. In other words, for light-emitting devices where a substrate is not disposed between the active region and the phosphor layer, the binding material and the phosphors of the phosphor layer can be selected so that the refractive index of the phosphor layer is close as practical to the refractive index of the device layer of the active region adjacent to the phosphor layer. Said another way, when chooses between two possible sets of binding materials and phosphors for the phosphor layer when designing a light-emitting device, the set of binding material and phosphors having a closer matching refractive index to the adjacent device layer should be selected.

Alternatively, for embodiments where a substrate is disposed between the active region and the phosphor layer, when choosing between two possible sets of binding materials and phosphors for the phospher layer when designing a light-emitting device, the set of binding material and phosphors having a closer matching refractive index to the substrate should be selected.

The above discussion is sufficient when the concentration of phosphors within the phosphor is low, and therefore the refractive index of the phosphor layer does not substantially vary with the wavelengths associated with light. The phosphor concentration is low when the refractive index of the phosphor layer is predominately defined by the refractive index of the binding material for the phosphor layer. Said another way, the phosphor concentration is low when phosphor layer refractive index at wavelengths associated with light produced by the active region is substantially the same as the phosphor layer refractive index at wavelengths associated with light wavelength-converted by the phosphor layer. In other words, when the phosphor layer has relatively low dispersion, the phosphor concentration is low.

An alternative design consideration exists when the phosphor layer has a high phosphor concentration within the binding material. In such case, the phosphor layer likely has strong absorption at wavelengths associated with light produced by the active region of the light-emitting device. Consequently, the phosphor layer refractive index, $n_{cc}$, at wavelengths associated with light produced by the active region differs from the phosphor layer refractive index, $n_{cr}$, at wavelenghts associated with light wavelength-converted by the phosphor layer. This is the case, for example, with impurity ion-activated CdS and ZnS phosphors as well as with organic dye phosphors due to the strong Frank-Condon shift in organic materials.

In such cases where the phosphor layer refractive index varies with wavelength, the binding material and the phosphors should be selected so that the phosphor layer refractive index, nce, at wavelengths associated with light produced by the active region substantially equals the refractive index of the layer adjacent to and in contact with the phosphor layer (e.g., substrate 130 as shown in FIG. 1, or device layer 223 as shown in FIG. 2). If $n_{ce} \equiv n_a$, no reflection losses occur and all the light produced in the active region propagating in the direction of phosphor layer could be converted to the wavelength-converted light. Similarly, this binding material and the phosphors also should be selected so that the phosphor layer refractive index, $n_{cr}$, at wavelengths associated with light wavelength-converted by the phosphor layer substantially equals the refractive index of the medium exterior to the phosphor layer. Such a medium can be, for example, an epoxy (having a refractive index of, for example, between 1.4 to 1.6), air, water, a vacuum, or other types of media having their own respective refractive index.

The term "substantially equal" in this context means as close as practical. In other words, for light-emitting devices where a substrate is disposed between the active region and the phosphor layer, the binding material and the phosphors can be selected so that the refractive index of the phosphor layer, nce, at wavelengths associated with light produced by the active region is close as practical to the refractive index of the substrate. Similarly, the phosphor layer refractive index, $n_{cr}$, at wavelengths associated with light wavelength-converted by the phosphor layer can be selected to be as close as practical to the refractive index of the medium exterior to the phosphor layer.

Taking into account that the internal efficiency of wavelength conversion for phosphors considered is close to 100%, the dispersion of refractive index of the phosphor layer, $n_c$, can lead to the enhancement of the absolute value of the device external radiation efficiency. Using the approximation for $\eta_e$ given by equation (2), the ratio of the external efficiency for wavelength-converted radiation to the efficiency of an ultraviolet/blue light-emitting device not having phosphor coating, equals to $0.5\, n_a\, (n_a+1)^2 / n_{cr}\, (n_{cr}+1)^2$. The factor 0.5 is used because only half of the wavelength-converted radiation propagates in the direction of the emitting surface. Despite this, if, for example, $n_a = n_{ce} = 2.5$ and $n_{cr} = 1.5$, the quantum efficiency of wavelength-converted radiation is expected to be 50% higher than efficiency of an ultraviolet/blue light-emitting device and its absolute value can be as high as 5% even in the framework of the one light-path model considered so far.

Figure 4:
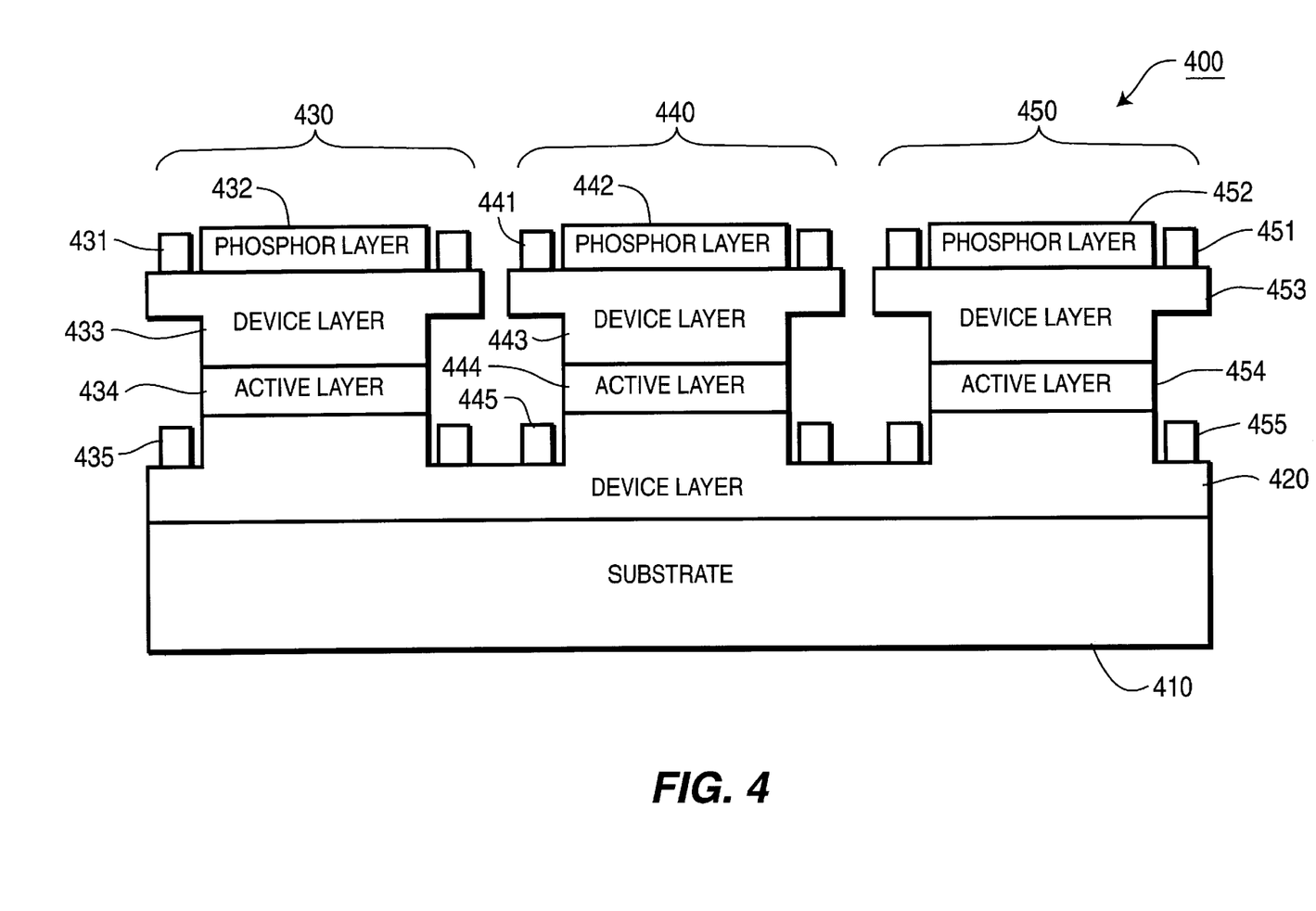
FIG. 4 illustrates a portion of a light-emitting device having three color pixels according to an embodiment of the present invention.

FIG. 4 illustrates a portion of a light-emitting device having three color pixels according to an embodiment of the present invention. Light-emitting device 400 can include substrate 410, device layer 420, and pixels 430, 440 and 450. Each pixel 430, 440 and 450 can represent an individual color for a display application. For example, pixel 430 can produce light having wavelengths corresponding to red, pixel 440 can produce light having wavelengths corresponding the color green, and pixel 450 can produce light having wavelengths corresponding to the color blue. Of course, although FIG. 4 illustrates a portion of an example of a light-emitting device (i.e., the portion having three pixels), such a light emitting device can include multiple pixels in, for example, a two-dimensional array. In such a configuration, each pixel can be individually addressable to provide a color display.

Pixel 430 further includes contact 431, phosphor layer 432, device layer 433, active layer 434 and contact 435. For pixel 430, the active region 434 can be defined as the device layer 433, active layer 434 and the portion of device layer 420 that is adjacent and in contact with active layer 434 and contact 435.

Pixel 440 further includes contact 441, phosphor layer 442, device layer 443, active layer 444 and contact 445. For pixel 440, the active region 444 can be defined as the device layer 443, active layer 444, and the portion of device layer 420 in contact with active layer 444 and contact 445.

Finally, pixel 450 further includes contact 451, phosphor layer 452, device layer 453, active layer 454 and contact 455. For pixel 450, the active region 454 can be defined as the device layer 453, active layer 454, and the portion of device layer 420 in contact with active layer 445 and contact 455.

The phosphor layers 432, 442 and 452 can be selected so that each corresponding pixel 430, 440 and 450, respectively, emits light having wavelengths corresponding, in general to red, green and blue, respectively. More specifically, pixel 450 can emit light having a band of wavelengths with a center wavelength between approximately 400 nanometers and approximately 550 nanometers. Pixel 440 can emit light having a band of wavelengths with a center wavelength between approximately 430 nanometers and approximately 650 nanometers. Pixel 430 can emit light having a band of wavelengths with a center wavelengths between approximately 550 nanometers and approximately 750 nanometers.

In an alternative embodiment, the phosphor layer associated with the pixel that produces light having wavelengths between approximately 400 nanometers and approximately 550 nanometers (i.e., blue wavelengths) need not be present. In other words, the active layer of the pixel associated with blue wavelengths can be selected so that the active layer produces light having predominately blue wavelengths. An associated phosphor layer need not be necessarily present to perform wavelength conversion. Thus, the light produced in that active layer can just be directly transmitted for that associated pixel.

The external efficiency of a light-emitting device can be considerably increased in the case of multi-path light processes. The light produced by an active layer propagating in a direction opposite from the wavelength-converting phosphor layer can be reflected back, thereby doubling the pumping efficiency of the active layer into the phosphor layer. A reflective layer, for example, can be optically coupled to the active region. The term "optically coupled" is used here to mean operatively associated such that light emitted from the active region is reflected by the reflective layer. For example, the reflective layer may be adjacent to and in contact with the active layer, or an intervening layer (e.g., a substrate) may be disposed between the reflective layer and the active layer.

In addition, another reflective layer that is wavelength selective can be disposed between the active region and the phosphor layer. Such a wavelength-selective reflective layer would allow light produced within the active region to be transmitted and allow light produced with the phosphor layer to be reflective back out towards the emitting surface of the light-emitting device. For example, wavelength selective reflecting GaN/AlGaN filters can be grown on a sapphire substrate.

Figure 5:
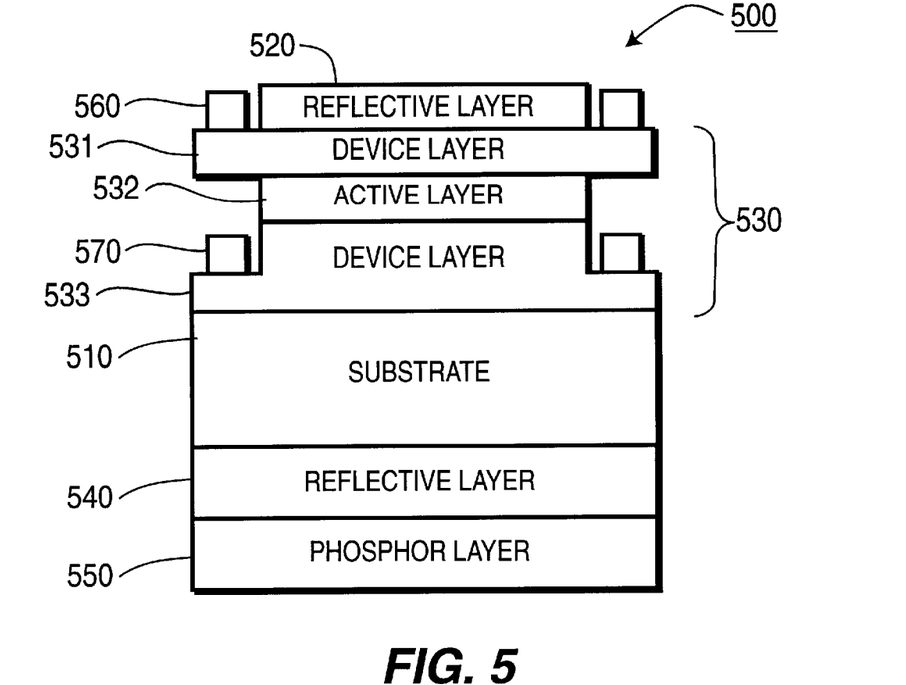
FIG. 5 illustrates a light-emitting device having at least one reflective layer according to another embodiment of the present layer.

FIG. 5 illustrates a light-emitting device having at least one reflective layer according to another embodiment of the present invention. Light-emitting device 500 includes substrate 510, contact 560, reflective layer 520, active region 530, reflective layer 540, phosphor layer 550 and contact 570. Active region 530 includes device layer 531, active layer 532 and device layer 533. In this embodiment, reflective layer 520 is configured to reflect light having the band of wavelengths produced by active layer 532 of active region 530 as well as phosphor-converted light having a second band of wavelengths produced in phosphor layer 550. In other words, active layer 532 can produce light having a first band of wavelengths (e.g., predominately blue colored light) that is propagated towards reflective layer 520. Similarly, light can be wavelength-converted by phosphor layer 550 and propagate towards reflective layer 520. In such a case, reflective layer 520 can reflect both light having the first band of wavelengths and light having the second band of wavelengths (i.e., light wavelength-converted by phosphor layer 500).

Reflective layer 540 can be a wavelength selective reflective layer. In other words, reflective layer 540 can be configured so that light having the first band of wavelengths (i.e., light produced by active layer 532) is transmitted while light having the second band of wavelengths (i.e., wavelength-converted light) produced in phosphor layer 550 is reflected at the boundary between reflective layer 540 and phosphor layer 550. By reflecting the wavelength-converted light at this boundary, this light is then allowed to exit light-emitting device 500 more efficiently and does not needlessly propagate through the other layers of light-emitting device 500 (e.g., device layer 533, active layer 532, device layer 531).

In alternative embodiments, only one reflective layer can be present. In other words, in other embodiments, the reflective layer between the contact and the device layer can be present without a reflective layer between device layer and phosphor layer being present. In another embodiment, the opposite may be true; in other words, the reflective layer between the device layer and phosphor layer may be present, while the reflective layer between the contact and the device layer are not present.

Figure 6:
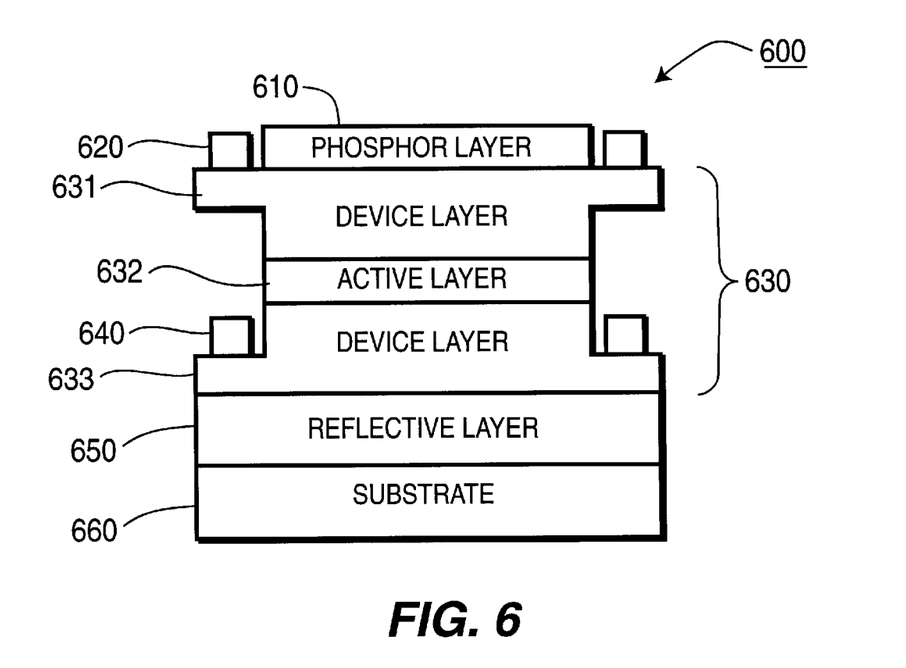
FIG. 6 illustrates a light-emitting device having a reflective layer according to yet another embodiment of the present invention.

FIG. 6 illustrates a light-emitting device having a reflective layer according to yet another embodiment of the present invention. Light-emitting device 600 includes phosphor layer 610, contact 620, active region 630, contact 640, reflective layer 650 and substrate 660. Active region 630 includes device layer 631, active layer 632 and device layer 633.

Reflective layer 650 is configured to reflect light having the first band of wavelengths (e.g., light produced by active layer 632 of active region 630) and light having a second band of wavelengths (e.g., light produced through wavelength-conversion by phosphor layer 610). In other words, light produced by active layer 632 can propagate in the direction of reflective layer 650 and light produced through wavelength-conversion in phosphor layer 610 can also be propagated in the direction of reflective layer 650. Light having either of these bands of wavelengths are reflected by reflective layer 650 are redirected towards phosphor layer 610 where the light can ultimately exit light emitting 600.

Although not shown in FIG. 6, a wavelength-selective reflective layer can be disposed between device layer 631 and phosphor layer 620. Such a wavelength-selective reflective layer, can be configured so that light having a first band of wavelengths (i.e., light produced by active layer 632) is transmitted while light having a second band of wavelengths (i.e., wavelength-converted light) produced in phosphor layer 620 is reflected at the boundary between the wavelength-selective reflective layer and phosphor layer 620.

The concept of the reflective layer shown in FIG. 6 can also be applicable to other embodiments of the present invention such as, for example, light-emitting device 400 shown in FIG. 4. In such an embodiment, a reflective layer can be added between device layer 420 and substrate 410. In such an embodiment, the reflective layer reflects all wavelengths for the light produced in active layers 434, 444 and 454, as well as wavelength-converted light produced in phosphor layers 432, 442 and 452. Said another way, such a reflective layer can reflect light having, for example, predominately ultraviolet to blue wavelengths produced in the active layers and can also reflect wavelength-converted light having predominately blue color associated with pixel 450, a green color produced by pixel 440, and a red color produced by pixel 430. Similarly, a wavelength-selective reflective layer can be disposed between phosphor layer 432 and device layer 433.

The external efficiency of a light-emitting device described above can be further improved by collecting light emitted in the directions close to parallel to the plane of device layers (i.e., close to parallel to the direction of propagation out of the light-emitting device). GaN device layers of the active region form a waveguide because their effective refractive index is higher than that of the substrate. Inclined sidewalls of the device (e.g., a mesa-like structure) can redirect waveguided radiation in the direction of the emitting surface (i.e., the external surface of the phosphor layer) thereby again almost doubling the external efficiency of the light-emitting device. The light-emitting device described above that incorporates the reflective layer and a mesa-like structure can potentially achieve external efficiency for the device as high as 20–30% throughout all of the visible spectrum.

Figure 7:
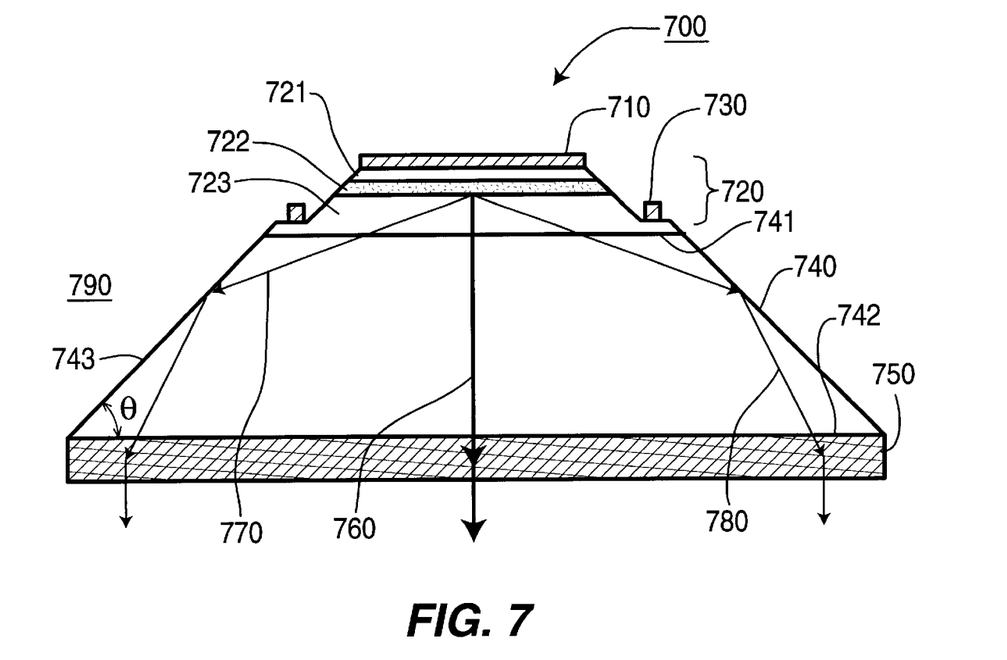
FIG. 7 shows a light-emitting device having a mesa structure according to embodiment of the present invention.

FIG. 7 shows a light-emitting device having a mesa structure according to embodiment of the present invention. Light-emitting device 700 includes a contact 710, active region 720, contact 730, substrate 740 and phosphor layer 750. Active region 720 includes device layer 721, active layer 722, and device layer 723. Substrate 740 includes a first side 741, a second side 742 and side wall 743. Also shown in FIG. 7, a set of rays showing light propagating through light-emitting device 700 are rays 760, 770 and 780.

Substrate 740 forms a mesa structure. More specifically, substrate 740 has a sidewall 740 that forms an incline angle, $\theta$, which is non-normal to the surface of second side 742 of substrate 740. Said another way, because the first side 741 of substrate 740 has a smaller area than the second side 742 of substrate 740, the sidewall 743 formed by substrate 740 is at an incline.

A medium is disposed exterior to and in contact with the sidewall 743 of substrate 740. This external medium has its own refractive index and is label in FIG. 7 as 790.

The particular incline angle appropriate for sidewall 743 depends on the refractive index of the substrate and the refractive index of the exterior medium 790. More particularly, the refractive index of exterior medium 790 and the refractive index of substrate 740 are factors because light emitted within substrate 740 interacts at the sidewall 743 according to Snell's law. The exterior medium 790 can be, for example, an epoxy (having a refractive index of, for example, between 1.4 to 1.6), air, a vacuum, or other types of media having their own respective refractive index. The refractive index of the substrate 740 can be, for example, between 1.75 and 2.0.

The particular refractive index of substrate 740 and the refractive index of the exterior medium 790 can define how light propagating within substrate 740 can be reflected according to totally internal reflection. The following relationship can define an optimal incline angle: $\theta < 90° - \arcsin(n_2/n_1)$, where $n_1$ is the refractive index of the substrate 740 and $n_2$ is the refractive index of the exterior medium 790.

Of course, this relationship can be generalized for other layers of the device by equating $n_2$ with the refractive index of that layer of the light-emitting device and by equating $n_1$ with the medium exterior to that layer. Thus, just as the sidewall of substrate can be inclined, so too can the corresponding sidewalls of device layers 721, active layer 722 and device layer 723 can be inclined. The incline angle of the sidewalls for layers 721, 722 and 723 can be the same or can be different from the incline angle of the sidewall 743 for substrate 740. Said another way, at least one side wall from the first device layer, the active layer, the second device layer and/or the substrate can be inclined to direct more light towards the emitting surface.

As an example, where the exterior medium is an epoxy having a refractive index of between 1.4 and 1.7, the substrate is a sapphire substrate having a refractive index of approximately 1.75 and the layers of the active region have refractive indices of approximately 2.0, the incline angle, $\theta$, of the sidewalls for the light-emitting device will between approximately 40 degrees and 60 degrees.

By allowing rays varying from the direction of propagation, such as ray 770 and 780, to be reflected by total internal reflection at sidewall 743, more light is propagated out of light-emitting device 700 via phosphor layer 750.

Figure 8:
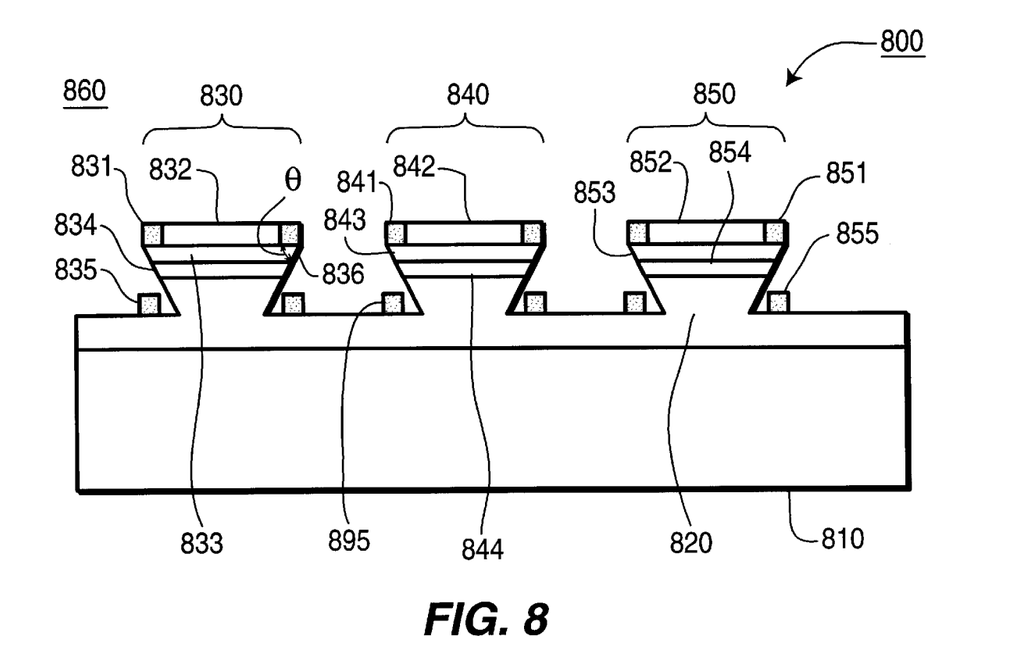
FIG. 8 illustrates a light emitting device having multiple pixels where each pixel have a mesa-like structure according to the embodiment of the present invention.

FIG. 8 illustrates a light emitting device having multiple pixels where each pixel have a mesa-like structure according to the embodiment of the present invention. Light-emitting device 800 includes substrate 810, device layer 820, and pixels 830, 840 and 850. Pixel 830 includes contact 831, phosphor layer 832, device layer 833, active layer 834 and contact 835. Similarly, pixel 840 includes contact 841, phosphor layer 842, device layer 843, active layer 844 and contact 845. Similarly, pixel 850 includes contact 851, phosphor layer 852, device layer 853, active layer 854, and contact 855.

Similar to the mesa structure discussed in reference to light-emitting device 700 shown in FIG. 7, a given pixel or multiple pixels of light-emitting device 800 showed in FIG. 8 can have a mesa structure. The following discussion relate to pixel 830, although an analogous structure can also be implemented for pixels 840 and 850, as well as any other pixels (not shown) of a two-dimensional pixel array for light-emitting device 800.

Device layer 833, which is disposed between and in contact with phosphor layer 832 and active layer 834, has a first side that is adjacent to active layer 834 and a second side that is adjacent to phosphor layer 832 and a sidewall 836. A medium exterior to sidewall 836 is labeled in FIG. 8 as 860 and has its own refractive index.

Sidewall 836 can be inclined at angle, $\theta$. This incline angle, $\theta$, should be less than 90 degrees and as discussed above can vary between 40 and 60 degrees according to the above-described relationship between $\theta$, the refractive index of exterior medium and the refractive index of the device layer 833. Note also that the analogous sidewalls of active layer 834 and the portion of device layer 820 adjacent to active layer 834 can also be inclined at an angle, such as, for example, the incline angle, $\theta$.

It should, of course, be understood that while the present invention has been described in reference to particular configurations, other configurations should be apparent to those of ordinary skill in the art. For example, although the Figures show the light-emitting devices in cross section view, various configurations are possible so that the top view of the devices can be for example rectangular, circular or any other shape as appropriate. Note that the figures show the light-emitting devices in a manner that is not to scale. The light-emitting devices shown in Figures and discussed herein can be formed as a monolithic structure where the layers can disposed directedly together.

What is claimed is:

1. An apparatus, comprising:
    a substrate;
    an active region coupled to said substrate and including a plurality of device layers and an active layer, said active region configured to emit light having a first band of wavelengths from a first group of wavelengths;
    a phosphor layer being disposed between said active region and an exterior medium, said phosphor layer being configured to convert the first band of wavelengths of light emitted from said active region to a second band of wavelengths, a center wavelength of the second band of wavelengths being greater than a center wavelength of the first band of wavelengths; and
    a reflective layer being optically coupled to said active region, said active region being disposed between said reflective layer and said phosphor layer, said reflective layer being configured to reflect at least the first band of wavelengths and the second band of wavelengths;
    wherein, at least one of said device layers, active layer and substrate includes a first side, second side and at least one sidewall inclined from said second side at an angle, each said at least one layer has its own first refraction index, the sidewall of the at least one layer is adjacent to and in contact with said exterior medium having a second refractive index, and the angle, for each layer from the at least one layer, is not greater than ninety degrees minus arcsin of the second refractive index divided by the first refractive index of that layer.

2. The apparatus of claim 1, wherein:
    said plurality of device layers includes a first device layer and a second device layer, and
    the first device layer is between and in contact with said reflective layer and the active layer of said active region.

3. The apparatus of claim 2, further comprising;
    a second reflective layer disposed between and in contact with said substrate and said phosphor layer, said second reflective layer being configured to transmit light having the first band of wavelengths transmitted from said active region and reflect light having the second band of wavelengths transmitted from said phosphor layer;
    wherein, said substrate is disposed between said phosphor layer and the second device layer of the active region.

4. The apparatus of claim 1, wherein, the reflective layer is between and in contact with said substrate and at least one of said device layers of said active region.

5. The apparatus of claim 4, further comprising:
    a second active region, said second active region configured to emit light having the first band of wavelengths;
    a second phosphor layer being disposed between said second active region and the exterior medium, said second phosphor layer being configured to convert the first band of wavelengths of light emitted from said second active region to a third band of wavelengths, a center wavelength of the third band of wavelengths being greater than the center wavelength of the first band of wavelengths; and
    a third active region, said third active region having an active layer, a first device layer and a second device layer, the second device layer of said third active region being disposed adjacent to said reflective layer, said third active region configured to emit light having the first band of wavelengths,
    wherein, said reflective layer is further optically coupled to said second active region and said third active region, said second active region is disposed between said reflective layer and said second phosphor layer, and said reflective layer is configured to reflect the third band of wavelengths.

6. The apparatus of claim 5, further comprising:
    a third phosphor layer being disposed between said third active region and the exterior medium, said third phosphor layer being configured to convert the first band of wavelengths of light emitted from said third active region to a fourth band of wavelengths, a center wavelength of the fourth band of wavelengths being greater than the center wavelength of the first band of wavelengths.

7. The apparatus of claim 1, wherein the first group of wavelengths are between approximately 300 nm and approximately 500 nm.

8. The apparatus of claim 1, wherein:
    the first group of wavelengths are producible by the active layer constructed of at least $Al_xGa_{1-x}N$, x is a value between zero and one.

9. The apparatus of claim 7, wherein:
    the center wavelength of the first band of wavelengths is between approximately 400 nm and approximately 550 nm;
    the center wavelength of the second band of wavelengths is between approximately 430 nm and 650 nm; and
    the center wavelength of the third band of wavelengths is between approximately 550 nm and 750 nm.

10. An apparatus, comprising:
    an active region having an active layer, a first device layer and a second device layer, said active region configured to emit light having a first band of wavelengths from a first group of wavelengths;
    a phosphor layer, said phosphor layer being configured to convert the first band of wavelengths of light emitted from said active region to a second band of wavelengths, a center wavelength of the second band of wavelengths being greater than a center wavelength of the first band of wavelengths; and
    a substrate disposed between and in contact with the first device layer of said active region and said phosphor layer,
    wherein, at least one layer from the group of the first device layer, the active layer, the second device layer and said substrate each has a first side, a second side and a side wall between the first side and the second side, the first side having a first area, the second side having a second area greater than the first area; and,
    wherein, each layer from the at least one layer has its own first refraction index, the sidewall of the at least one layer is adjacent to and in contact with an exterior medium having a second refractive index, and the at least one side wall is inclined from the second side of the at least one layer at an angle not greater than ninety degrees minus arcsin of the second refractive index divided by the first refractive index of that layer.

11. The apparatus of claim 10, wherein:
    the angle for the at least one side wall is substantially between approximately forty degrees and approximately sixty degrees.

12. The apparatus of claim 10, wherein:
the first device layer of said active region has its own side wall having its own angle,
the active layer of said active region has its own side wall having its own angle, and
the second device layer of said active region has its own side wall having its own angle.

13. The apparatus of claim 10, wherein the first group of wavelengths are between approximately 300 nm and approximately 500 nm.

14. The apparatus of claim 10, wherein:
the first group of wavelengths are producible by the active layer constructed of at least $Al_xGa_{1-x}N$, x is a value between zero and one.

15. The apparatus of claim 10, wherein:
the active layer is constructed of at least $InGaN/Al_xGa_{1-x}N$, x is a value between zero and one,
the first device layer is a p-type GaN layer, and
the second device layer is an n-type GaN layer.

16. An apparatus, comprising:
an active region having an active layer, a first device layer and a second device layer, the active layer of said active region being configured to emit light having a first band of wavelengths from a first group of wavelengths; and,
a phosphor layer, the first device layer of said active region being disposed between said phosphor layer and the active layer of said active region, said phosphor layer being configured to convert the first band of wavelengths of light emitted from said active region to a second band of wavelengths, a center wavelength of the second band of wavelengths being greater than a center wavelength of the first band wavelengths; wherein,
the first device layer has a first side, a second side and a side wall between the first side and the second side, the first side having a first area and being adjacent to the active layer of said active region, the second side having a second area greater than the first area and being adjacent to said phosphor layer,
the side wall is inclined from the second side of the first device layer at an angle being less than ninety degrees; and,
the substrate has a first refraction index, the sidewall of said substrate is adjacent to an exterior medium having a second refractive index, and the angle is less than about ninety degrees minus arcsin of the second refractive index divided by the first refractive index.

17. The apparatus of claim 16, wherein:
the angle is substantially between approximately forty degrees and approximately sixty degrees.

18. The apparatus of claim 16, wherein:
the active layer of said active region has a side wall having the angle of the side wall of the first device layer, and
the second device layer of said active region has a side wall having the angle of the side wall of the first device layer.

19. The apparatus of claim 16, wherein the first group of wavelengths are between approximately 300 nm and approximately 500 nm.

20. The apparatus of claim 16, wherein:
the first group of wavelengths are producible by the active layer constructed of at least $Al_xGa_{1-x}N$, x is a value between zero and one.

21. The apparatus of claim 16 further comprising:
a second active region including a second active layer, a third device layer and a fourth device layer, the second active layer of said second active region being configured to emit light having the first band of wavelengths; and,
a second phosphor layer, the third device layer of said active region being disposed between said second phosphor layer and said second active layer, said second phosphor layer being configured to convert the first band of wavelengths of light emitted from said second active region to a third band of wavelengths, a center wavelength of the third band of wavelengths being greater than a center wavelength of the first band of wavelengths; wherein,
the third device layer has a first side having a first area and being adjacent to the second active layer of said second active region, a second side having a second area greater than the first area of the third device layer and being adjacent to said second phosphor layer, and a side wall between the first side and the second side of the third device layer; and,
the side wall of the third device layer is formed at a second angle inclined from the second side of the third device layer by less than ninety degrees.

22. The apparatus of claim 21, wherein:
the second angle is substantially between approximately forty degrees and approximately sixty degrees.

23. The apparatus of claim 21, wherein:
the active layer of said second active region has a side wall having the second angle of the side wall of the third device layer, and
the fourth device layer of said second active region has a side wall having the second angle of the side wall of the third device layer.

24. The apparatus of claim 21, further comprising:
a third active region including a third active layer, a fifth device layer and a sixth device layer, the third active layer of said third active region being configured to emit light having the first band of wavelengths.

25. The apparatus of claim 24, wherein:
the fifth device layer has a first side, a second side and a side wall between the first side and the second side of the fifth device layer, the first side of the fifth device layer having a first area and being adjacent to the third active layer of said third active region, the second side of the fifth device layer having a second area greater than the first area of the fifth device layer,
the side wall of the third device layer is formed at a third angle inclined from the second side of the fifth device layer, the second angle being less than ninety degrees,
the third active layer of said third active region has a side wall having the third angle of the side wall of the fifth device layer, and
the sixth device layer of said third active region has a side wall having the third angle of the side wall of the fifth device layer.

26. The apparatus of claim 23, wherein:
the center wavelength of the first band of wavelengths is between approximately 400 nm and approximately 550 nm;
the center wavelength of the second band of wavelengths is between approximately 430 nm and 650 nm; and
the center wavelength of the third band of wavelengths is between approximately 550 nm and 750 nm.

27. The apparatus of claim 1, wherein the phosphor layer is in contact with said active region and an exterior medium.

* * * * *